US010635620B2

(12) United States Patent
Tsai et al.

(10) Patent No.: US 10,635,620 B2
(45) Date of Patent: Apr. 28, 2020

(54) FUNCTIONAL MODULE BOARD

(71) Applicant: ADLINK Technology Inc., New Taipei (TW)

(72) Inventors: Yu-Li Tsai, New Taipei (TW); Yu-Yun Liu, New Taipei (TW); Shih-Hsun Chou, New Taipei (TW)

(73) Assignee: ADLINK TECHNOLOGY INC., New Taipei (TW)

( * ) Notice: Subject to any disclaimer, the term of this patent is extended or adjusted under 35 U.S.C. 154(b) by 0 days.

(21) Appl. No.: 16/186,184

(22) Filed: Nov. 9, 2018

(65) Prior Publication Data
US 2019/0361828 A1 Nov. 28, 2019

(30) Foreign Application Priority Data

May 28, 2018 (TW) .............................. 107118172 A

(51) Int. Cl.
*G06F 13/40* (2006.01)
*G06F 13/42* (2006.01)
*H01R 12/70* (2011.01)
*H01R 31/06* (2006.01)

(52) U.S. Cl.
CPC ...... *G06F 13/4004* (2013.01); *G06F 13/4282* (2013.01); *G06F 2213/0016* (2013.01); *G06F 2213/0026* (2013.01); *G06F 2213/0042* (2013.01); *H01R 12/7082* (2013.01); *H01R 12/7088* (2013.01); *H01R 31/065* (2013.01)

(58) Field of Classification Search
CPC ......... G06F 2213/0026; G06F 13/4004; H01R 12/7082; H01R 12/7088

USPC ........................................................ 710/301
See application file for complete search history.

(56) References Cited

U.S. PATENT DOCUMENTS

| 7,047,338 | B1 * | 5/2006 | Nguyen ................. G07F 17/32 463/42 |
| 9,122,469 | B2 * | 9/2015 | Wu ......................... G06F 1/263 |
| 2003/0226048 | A1 | 12/2003 | Nguyen et al. |

(Continued)

FOREIGN PATENT DOCUMENTS

| TW | 201032401 | 9/2010 |
| TW | 201039500 | 11/2010 |

(Continued)

OTHER PUBLICATIONS

Search Report dated Jun. 17, 2019 for European Application No. 18205288.6.

*Primary Examiner* — Glenn A. Auve

(57) ABSTRACT

A functional module board for outputting an output signal to an application terminal includes a main board and a sub board. The main board includes a processor and a main board connector. The sub board includes a sub board connector, a signal converter, and a signal output terminal. The main board connector is detachably connected to the sub board connector, and the processor sends a native signal to the sub board. The sub board converts the native signal to the output signal via the signal converter after receiving the native signal, and the signal output terminal outputs the output signal to the application terminal. The functional module board of the present application can change the design of the sub board according to different application terminal requirements in the case of the same main board to save the development cost.

10 Claims, 4 Drawing Sheets

(56) References Cited

U.S. PATENT DOCUMENTS

| | | | |
|---|---|---|---|
| 2004/0090761 A1 | 5/2004 | Chuang et al. | |
| 2005/0066102 A1* | 3/2005 | Yamamoto | G06F 13/387 |
| | | | 710/301 |
| 2007/0224844 A1* | 9/2007 | Chuang | G06F 13/409 |
| | | | 439/55 |
| 2008/0270663 A1* | 10/2008 | Fry | G06F 1/1616 |
| | | | 710/301 |
| 2009/0031062 A1* | 1/2009 | Shen | G06F 13/409 |
| | | | 710/100 |
| 2010/0005211 A1* | 1/2010 | Wen | G06F 1/185 |
| | | | 710/302 |
| 2011/0019384 A1 | 1/2011 | Kao et al. | |
| 2011/0043989 A1 | 2/2011 | Tien et al. | |
| 2011/0197005 A1* | 8/2011 | Liao | G06F 13/409 |
| | | | 710/301 |
| 2013/0238827 A1* | 9/2013 | Lin | G06F 13/4095 |
| | | | 710/301 |
| 2014/0156897 A1* | 6/2014 | Reinke | G06F 1/185 |
| | | | 710/301 |
| 2014/0281095 A1* | 9/2014 | Huang | G06F 13/128 |
| | | | 710/301 |
| 2019/0260383 A1* | 8/2019 | Brainard | H03M 1/0687 |

FOREIGN PATENT DOCUMENTS

| | | |
|---|---|---|
| TW | 201506633 | 2/2015 |
| TW | 201729514 | 8/2017 |
| TW | 201730570 | 9/2017 |

* cited by examiner

FUNCTIONAL MODULE BOARD

CROSS-REFERENCE TO RELATED APPLICATIONS

This application claims the priority benefit of Taiwan Application Serial No. 107118172 filed May 28, 2018 the disclosure of which is incorporated herein by reference.

BACKGROUND OF THE INVENTION

1. Field of the Invention

The present invention relates to a functional module board, and more specifically, to a functional module board having a sub board design, which could be changed according to different application terminal requirements in the case of the same main board.

2. Description of the Prior Art

Different industries have different requirements for computer products. In addition to the performance of the computer, the type and quantity of I/O Port on the computer are also important considerations while choosing a computer, because it leads to the question of whether the user's instruments and equipments can be connected to the computer or not. Besides, the input/output ports of these instruments and equipments for connecting to the computer are much more different on the basis of the requirements of the using environment. For example, the type of USB is Type A or Type B generally, but the equipments used under the high vibration environments would require a locking type I/O port such as M8 or M12. Therefore, a user will consider whether the input/output port of the computer can be used while selecting the computer to control the instrument. Additionally, in same factory plant or site, different computers might be chosen according to different input/output requirements for instruments and equipments. Lastly, managing different computers is also a cost for the users because the main board has to be customized for complying with the input/output requirements of the customers which are not found in the market, thus increasing the development cost of the customer.

Please refer to FIG. 1. FIG. 1 is a schematic drawing illustrating a main board 110 and a sub board 120 in the prior art. In the prior art, the main board 110 includes a processor 112, a signal converter 114 and a main board connector 116. The signal converter 114 is connected to the processor 112 and the main board connector 116. The sub board 120 includes a signal output terminal 122 (I/O port) and a sub board connector 126. The signal output terminal 122 is connected to the sub board connector 126. In response to the above problems, the prior art provides a solution to separate the signal output terminal of the main board 110 from the main board 110 and configure the signal output terminal 122 on the sub board 120. The main board connector 116 of the main board 110 is detachably connected to the sub board connector 126 of the sub board 120. The number and type of the signal output terminals 122 are increased in the manner of replacing the sub board 120. However, the output signal S2 outputted to the sub board 120 is converted from the native signal S1 outputted by the processor 122, via the signal converter 114 of the main board 110, thus the function of the sub board 120 is only to adjust the number and type of the signal output terminal 122 but not the output signal S2. If the output signals S2 required by the customer is different from the output signal S2 converted by the main board 110, the main board 110 still needs to be redesigned. However, designing a new main board means complicated procedures such as wiring, write drivers, and verification, which not only requires a lot of development time but also increases the development cost of the customer.

SUMMARY OF THE INVENTION

The present invention provides a functional module board for outputting an output signal to an application terminal, which includes a main board and a sub board. The main board includes a processor and a main board connector. The processor is connected to the main board connector and outputs a native signal. The sub board includes a sub board connector, a signal converter and a signal output terminal. The sub board connector is detachably connected to the main board connector for receiving the native signal. The signal converter is connected to the sub board connector and the signal output terminal for receiving the native signal, converting the native signal into the output signal according to the application terminal, and outputting the output signal via the signal output terminal. The signal output terminal is defined by the application terminal.

In one embodiment, the main board further includes a power slot for inputting a power source. The power slot is connected to the processor and the main board connector to drive the processor and provide a standby rail power for the sub board. The sub board further includes a power switching component and an external power slot. The power switching component is connected to the sub board connector and the signal converter for receiving the standby rail power, and converting the standby rail power into that with different timings according to a power manage signal to be provided to the signal converter. The external power slot is configured for connecting to an auxiliary power to provide the power source required by the sub board. Furthermore, the power slot of the main board transmits the standby rail power to the sub board connector via the main board connector. The pin arrangement for the main board connector and the sub board connector to transmit the standby rail power is power-ground-power.

In one embodiment, the power switching component outputs the voltage with 3.3V, 5V, or 12V by a standby rail power or a main rail power in two different timings according to the requirement of the signal converter.

In one embodiment, the sub board further includes a signal expand component connected to the sub board and the signal converter. The signal expand component amplifies the native signal into a plurality of native signals.

In one embodiment, the main board connector has double row of pins; the row of pins near to the processor is configured for transmitting high speed native signal; and the other row of pins is configured for transmitting low speed native signal.

In one embodiment, a plurality of holes are correspondingly configured on the main board and the sub board for connecting the main board connector and the sub board connector to fix the main board and the sub board.

The functional module board of the present invention outputs the native signal via the processor of the main board, and the native signal is transmitted to the sub board via the connector. After that, the signal converter of the sub board converts the native signal to the output signal, and the signal output terminal outputs the output signal to the application terminal. Compared with the prior art, the functional module board of the present invention makes the main board have compatibility, and the sub board design can be changed according to different application terminal requirements in the case of the same main board to provide various output signals and various signal output terminals (input/output ports) in different applications. That is to say, when customers need to develop new products, they only need to develop and design the sub board so as to eliminate the time and the cost of developing the main board. The present invention not only reduces the developing time of the products but also reduces the developing cost.

BRIEF DESCRIPTION OF THE APPENDED DRAWINGS

DETAILED DESCRIPTION OF THE INVENTION

For the sake of the advantages, spirits and features of the present invention can be understood more easily and clearly, the detailed descriptions and discussions will be made later by way of the embodiments and with reference of the diagrams. It is worth noting that these embodiments are merely representative embodiments of the present invention, wherein the specific methods, devices, conditions, materials and the like are not limited to the embodiments of the present invention or corresponding embodiments. Moreover, the devices in the figures are only used to express their corresponding positions and are not drawing according to their actual proportion.

Figure 1:
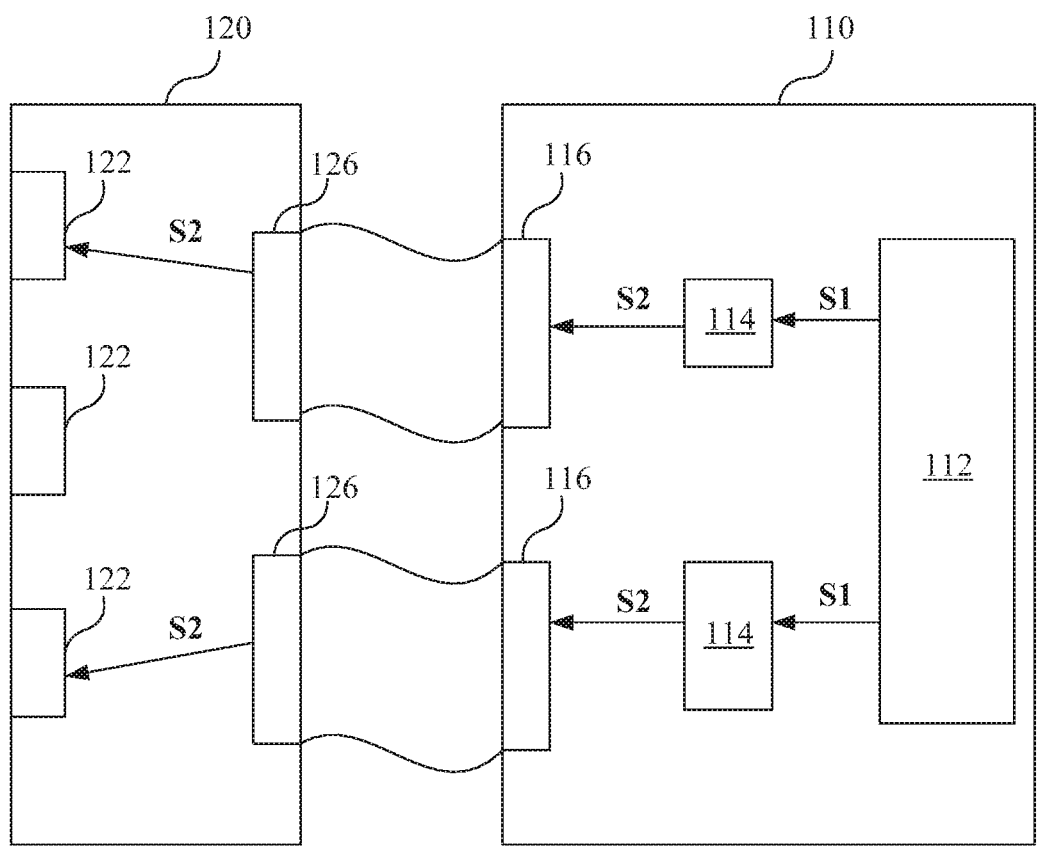
FIG. 1 is a schematic drawing illustrating a main board and a sub board in the prior art.
Figure 2:
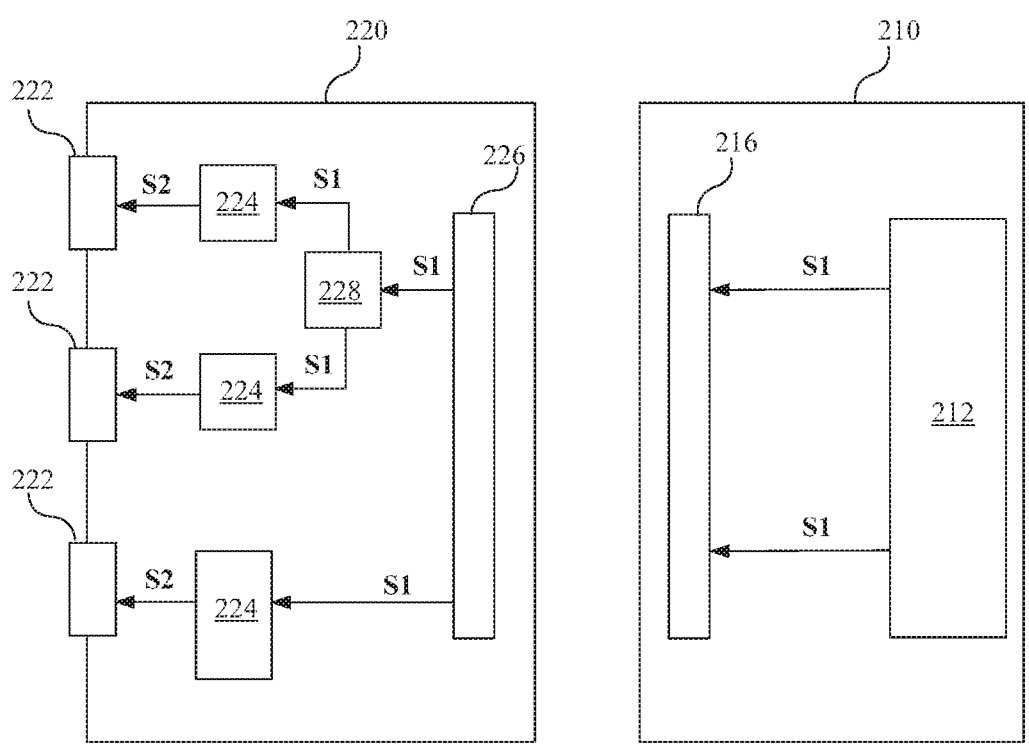
FIG. 2 is a schematic drawing illustrating a main board and a sub board of a functional module board according to an embodiment of the present invention.

Please refer to FIG. 2. FIG. 2 is a schematic drawing illustrating a main board and a sub board of the functional module board according to an embodiment of the present invention. The functional module board of the present invention includes a main board 210 and a sub board 220. The main board 210 includes a processor 212, a main board connector 216 and a power slot. The processor 212 is connected to the main board connector 216 and the power slot, and the main board connector 216 is connected to the power slot. The sub board 220 includes a signal output terminal 222, a signal converter 224, a sub board connector 226, a power switching component, a signal expand component 228 and an external power slot. The sub board connector 226 is detachably connected to the main board connector 216 and is connected to the power switching component, the signal converter 224 and the signal expand component 228. The signal converter 224 is connected to the signal output terminal 222.

Figure 3:
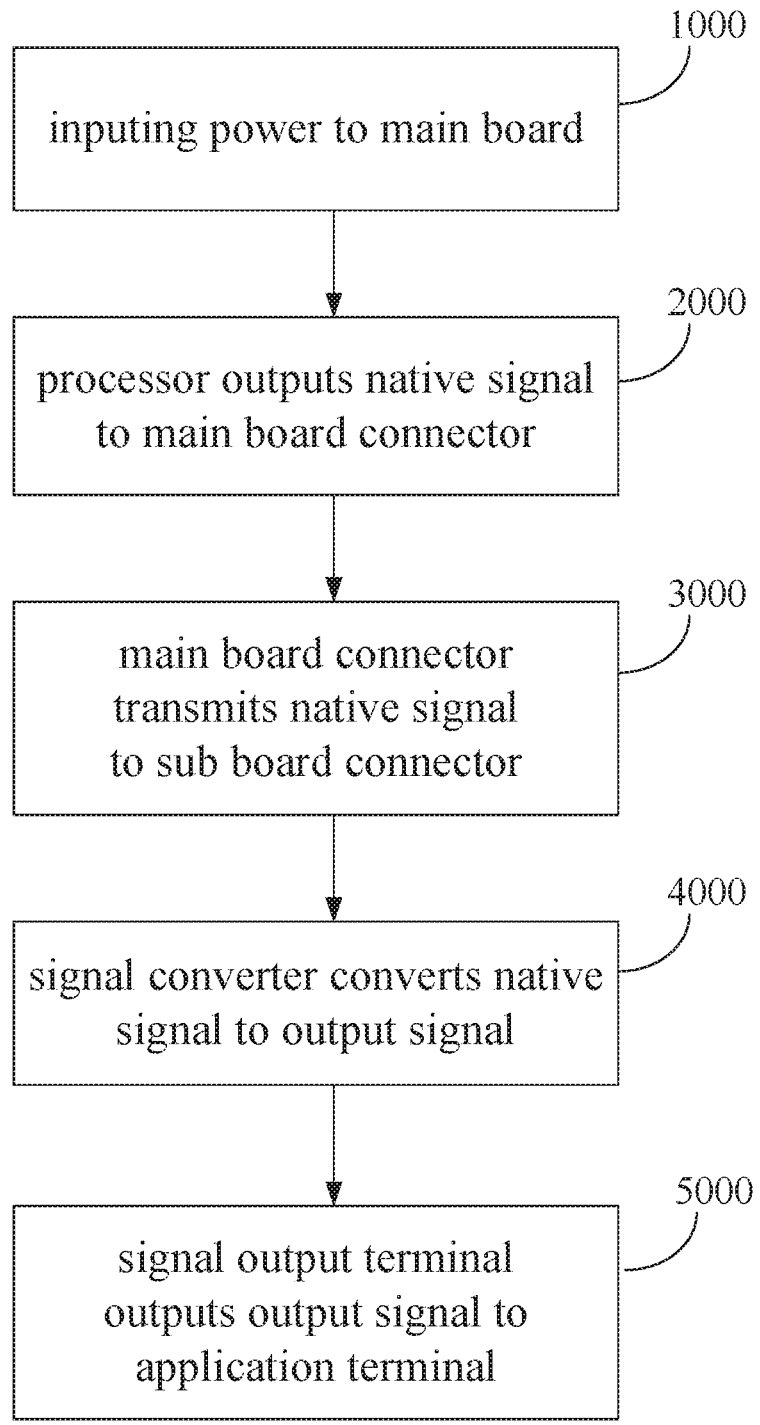
FIG. 3 is a flow chart illustrating the operation of the functional module board according to an embodiment of the present invention.

Please refer to FIG. 2 and FIG. 3 together. FIG. 3 is a flow chart illustrating the operation of the functional module board according to an embodiment of the present invention. In the step 1000, the power slot is provided for inserting a power supply for inputting a power to drive the processor 212, and the power is inputted into the sub board 220 by the main board connector 216. In practical applications, the power slot can be connected to a power management component for converting the DC circuit power inputted by the power supply to the power provided to the processor 212 and to a standby rail power with the voltages of 12V, 5V and 3V provided to the sub board 220. The sub board is in the startup state as the standby rail power is inputted to the component, and there is no special switch required to startup.

In the step 2000, the processor 212 generates a native signal S1 after the inputted power drives the processor 212, and outputs the native signal S1 to the main board connector 216. The native signal S1 includes, but not limited to, a high speed Peripheral Component Interconnect Express (PCIe), a Digital Display Interface (DDI), a Universal Serial Bus (USB), a Low Pin Count Bus (LPC), a Serial Peripheral Interface Bus (SPI), an Inter-IC Sound or Integrated Interchip Sound (I2S), or a System Management Bus (SMBus).

Figure 4:
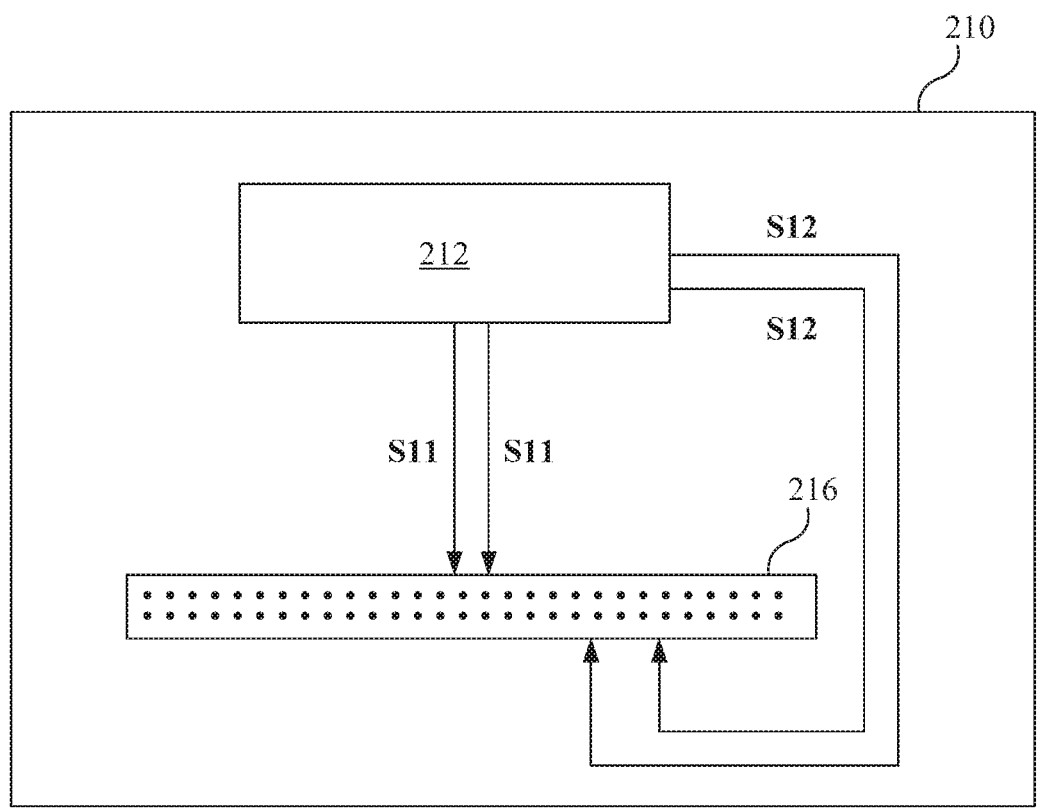
FIG. 4 is a schematic drawing illustrating a main board connector according to an embodiment of the present invention.

Furthermore, please refer to FIG. 4. FIG. 4 is a schematic drawing illustrating the main board connector 216 according to an embodiment of the present invention. In one embodiment, the main board connector 216 includes 150 pins arranged in an upper row and a lower row. The row of pins near the processor 212 side is configured for receiving a high speed native signal S11, and the other row of pins (away from the processor 212) is configured for receiving a low speed native signal S12. Since the high speed native signal S11 needs massive and frequent data transmission, the row of pins near the processor 212 side is selected to transmit the high speed native signal S11, and the purpose is to enable the high speed native signal S11 to be transmitted to the sub board 220 via the shortest path to avoid signal distortion. In contrast, the low speed native signal S12 has a lower requirement for transmission speed, so it is chosen to match the other row of pins (away from the processor 212) to bypass other components during layout routing, and then the circuit configuration of the board becomes more flexible. The high speed native signal S11 includes, but not limited to, high speed Peripheral Component Interconnect Express (PCIe) and Digital Display Interface (DDI); the low speed native signal S12 includes, but not limited to, Universal Serial Bus (USB), Low Pin Count Bus (LPC), Serial Peripheral Interface Bus (SPI), Inter-IC Sound or Integrated Interchip Sound (I2S) and the like.

The other feature of the main board connector 216 of the present invention is the pin arrangement of the power source. The pin arrangement for the main board connector 216 is POWER-GND-POWER, so that each set of power pins is separated by a set of grounding pins to dissipate the heat generated during transmission of power. In one embodiment, the main board connector 216 includes a set of power manage signal pins for receiving a power manage signal sent by the processor 212. The power manage signal is configured for controlling the timing to convert the standby rail power to the main rail power of the sub board 220.

In the step 3000, the main board connector 216 of the main board 210 transmits the native signal S1 to the sub board connector 226 of the sub board 220. The main board connector 216 and the sub board connector 226 have corresponding pins, and are connected to each other in a board-to-board connector type. In one embodiment, a plurality of holes are correspondingly configured on the main board 210 and the sub board 220. When the main board connector 216 is coupled with the sub board connector 226, the copper column can be configured in the holes to fix the relative positions of the main board 210 and the sub board 220. In practical applications, an overlapping area is generated while the main board 210 and the sub board 220 are connected via the main board connector 216 and the sub board connector 226. The lower height components can be configured in the overlapping area, so that the main board 210 and the sub board 220 can be assembled smoothly without interference during the assembling.

In the step 4000, the sub board connector 226 outputs the native signal S1 to the signal converter 224, and the signal converter 224 converts the native signal S1 to the output signal S2. The signal converter 224 converts the native signal S1 to the output signal S2 according to the application terminal requirements. For examples, if the application terminal requirement is a sound source output of microphone, an Audio chip (signal converter 224) is configured to convert the Inter-IC Sound or Integrated Interchip Sound (I2S) (native signal S1) to the microphone signal (output signal S2); and if the application terminal requirement is an image output, a VGA bridge IC (signal converter 224) is configured to convert the Digital Display Interface (DDI) (native signal S1) to the VGA Signal (output signal S2).

In practical applications, the power switching component of the sub board 220 receives the standby rail power and the power manage signal from the sub board connector 226 and controls the timing to convert the standby rail power to the main rail power according to the power manage signal. In practical applications, if the power switching component receives the power manage signal, it converts the timing of the standby rail power to that of the main rail power and outputs the main rail power; if the sub board 220 has no requirement of the main rail power according to the sub board 220 applications, the power switching component inputs the standby rail power directly to provide the power. Due to the main board 210 provides the standby rail power with 3.3V, 5V and 12V to the sub board 220, and the standby rail power can be changed the timing by the power switching component. Thus, the present invention can provide different powers to different signal converters 224 according to the requirements of the voltage and timing of the signal converter 224. For examples, when the Peripheral Component Interconnect Express (PCIe) (native signal S1) is converted to the Ethernet Signal via the LAN Chip, the standby rail power with 3.3V voltage is required; and when the Digital Display Interface (DDI) (native signal S1) is converted to the VGA Signal (output signal S2) via the VGA bridge IC (signal converter 224), the standby rail power with 3.3V voltage and the main rail power with 5V voltage are required at the same time. The power switching component is utilized in the present invention of the sub board 220 to convert the standby rail power to the power sources with specific voltages and timings according to the features of the signal converter 224, so that the main board 210 only needs to input the power with fixed voltage and the timing, thereby improving the compatibility of the main board 210.

In one embodiment, if the amount of the signals and signal types in the output signal S2 of the application terminal requirements is large, causing the required power larger than the standby rail power provided by the main board 210, the external power slot of the sub board 220 can be configured for receiving an external power to provide extra auxiliary power for the sub board 220. Therefore, the transmission and amplification of the output signal S2 will not be limited to the power supply.

In the step 5000, the signal converter 224 transmits the output signal S2 to the signal output terminal 222, and the signal output terminal 222 outputs the output signal S2 to the application terminal. In practical applications, the signal output terminal 222 is an input/output port (I/O port), and it can be defined by the requirements of the application terminal. For example, if the application terminal is required to be applied in the high vibration environment such as railways, the signal output terminal 222 can use a lockable connector such as M8 or M12.

In one embodiment, the signal expand component 228 can be connected between the sub board connector 226 and the signal converter 224 for expanding the native signal S1, and then, a plurality of native signals S1 are converted to the output signals S2 via the signal converter 224 according to the application terminal requirements. For example, if the application terminal requirement is applied in a place with a lot of equipments such as a factory, the native signal S1 is amplified to a plurality of native signals S1 via the signal expand component 228, and then, the same or different output signals S2 converted respectively by the plurality of native signals S1 are outputted via the signal output terminal 222 according to the factory requirements. In practical applications, the signal expand component 228 can be a USB Hub IC or a PCIe Switch IC, but it is not limited thereto.

In one embodiment, some of the native signals S1 outputted by the main board 210 are not necessary to be converted and are outputted to the application terminal via the signal output terminal 222 directly, such as the Universal Serial Bus (USB) signal. Therefore, in some specific application embodiments, the sub board 220 has no need to include the signal converter 224.

The functional module board of the present invention outputs the native signal and the standby rail power by the main board, and the native signal and the standby rail power are transmitted to the sub board via the connector. The sub board converts the standby rail power to the required power source of the signal converter, uses the signal converter to convert the native signal to the output signal, and then outputs the output signal to the application terminal via the signal output terminal. Compared with the prior art, the functional module board of the present invention makes the main board have compatibility, and the sub board design can be changed according to different requirements of the application terminal in the case of the same main board to provide various output signals and various signal output terminals (input/output ports) in different applications. That is to say, when customers need to develop new products, they only need to develop and design the sub board so as to eliminate the time and the cost of developing the main board. The present invention not only reduces the developing time of the products but also reduces the developing cost.

The features and spirits of the present invention are hopefully described more clearly by the above detailed description of the preferred embodiments, and the scope of the present invention is not limited by the preferred embodiments disclosed above. On the contrary, the purpose is to cover a variety of changes and equivalence arrangements within the scope of the patent application to be applied for by the creative institute. Therefore, the scope of the patent scope of the present invention should be interpreted broadly based on the description above, so that it covers all possible changes and arrangements of equality.

What is claimed is:

1. A functional module board for outputting a output signal to an application terminal, comprising:
   a main board comprising a processor and a main board connector, the processor being connected to the main board connector, wherein the processor outputs a native signal; and
   a sub board comprising a sub board connector, a signal converter and a signal output terminal, the sub board connector being detachably connected to the main board connector for receiving the native signal, the signal converter being connected to the sub board connector and the signal output terminal for receiving the native signal and converting the native signal only into the output signal, and outputting the output signal through the signal output terminal, wherein the signal output terminal is defined by the application terminal, and the main board further comprises a power slot connected to the processor and the main board connector for inputting power to drive the processor and provide a standby rail power for the sub board.

2. The functional module board of claim 1, wherein the power slot transmits the standby rail power to the sub board connector through the main board connector, and the pin arrangement for the main board connector and the sub board connector to transmit the standby rail power is power-ground-power.

3. The function module board of claim 1, wherein the sub board further comprises a power switching component connected to the sub board connector and the signal converter, the power switching component is configured for receiving the standby rail power, and converting the standby rail power with different timings according to a power manage signal to be provided to the signal converter.

4. The functional module board of claim 3, wherein the power switching component outputs 3.3V, 5V, or 12V power source by the standby rail power or a main rail power in two different timings according to a requirement of the signal converter.

5. The functional module board of claim 1, wherein the signal converter converts the native signal into the output signal required by the application terminal according to the application terminal.

6. The functional module board of claim 1, wherein the sub board further comprises a signal expand component connected to the sub board connector and the signal converter, and the signal expand component amplifies the native signal into a plurality of native signals.

7. The functional module board of claim 1, wherein the main board connector has double rows of the pins, one row of the pins closer to the processor than the other row of the pins is configured for transmitting a high speed native signal, and the other row of the pins is configured for transmitting a low speed native signal.

8. The functional module board of claim 1, wherein a plurality of holes are correspondingly configured on the main board and the sub board for connecting the main board connector and the sub board connector to fix the main board and the sub board.

9. The functional module board of claim 1, wherein the sub board further comprises an external power slot configured for connecting an auxiliary power.

10. A functional module board for outputting a output signal to an application terminal, comprising:
   a main board comprising a processor and a main board connector, the processor being connected to the main board connector, wherein the processor outputs a native signal; and
   a sub board comprising a sub board connector, a signal converter and a signal output terminal, the sub board connector being detachably connected to the main board connector for receiving the native signal, the signal converter being connected to the sub board connector and the signal output terminal for receiving the native signal and converting the native signal into the output signal, and outputting the output signal through the signal output terminal, wherein the signal output terminal is defined by the application terminal, the sub board further comprises a signal expand component connected to the sub board connector and the signal converter, and the signal expand component amplifies the native signal into a plurality of native signals;
   wherein the native signal includes a high speed Peripheral Component Interconnect Express (PCIe), a Digital Display Interface (DDI), a Universal Serial Bus (USB), a Low Pin Count Bus (LPC), a Serial Peripheral Interface Bus (SPI), an Inter-IC Sound or Integrated Interchip Sound (I2S), or a System Management Bus (SMBus).

* * * * *